(12) United States Patent
Zhang et al.

(10) Patent No.: US 6,212,099 B1
(45) Date of Patent: Apr. 3, 2001

(54) PREVENTING DATA CORRUPTION IN A MEMORY DEVICE USING A MODIFIED MEMORY CELL CONDITIONING METHODOLOGY

(75) Inventors: Suibin Zhang, Milpitas; Ravi Annavajjhala, Folsom; Robert L. Baltar, Folsom; Dow-Ping D. Wong, Folsom; Marc E. Landgraf, Folsom, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/378,306

(22) Filed: Aug. 20, 1999

(51) Int. Cl.$^7$ .................................................. G11C 16/04
(52) U.S. Cl. ............................ 365/185.11; 365/185.29; 365/185.3
(58) Field of Search .......................... 365/185.11, 185.12, 365/185.13, 185.29, 185.3, 185.33

(56) References Cited

U.S. PATENT DOCUMENTS

| | | |
|---|---|---|
| 5,509,134 | 4/1996 | Fandrich et al. . |
| 5,572,707 | 11/1996 | Rozman et al. . |
| 5,748,528 * | 5/1998 | Campardo et al. ............. 365/185.13 |
| 5,748,939 | 5/1998 | Rozman et al. . |
| 5,886,923 * | 3/1999 | Hung ................................ 365/185.11 |
| 5,907,700 | 5/1999 | Talreja et al. . |
| 5,978,275 * | 11/1999 | Song et al. ....................... 365/185.29 |

* cited by examiner

Primary Examiner—David Nelms
Assistant Examiner—Gene Auduong
(74) Attorney, Agent, or Firm—Blakely, Sokoloff, Taylor & Zafman LLP (57) ABSTRACT

An embodiment of the invention is directed to a method of operating a flash memory, which includes discharging at least one local wordline of an unselected block of flash memory cells during an interval in which a selected set of flash memory cells are being conditioned, such that the at least one local wordline does not develop a charge that is sufficient to corrupt the data stored in the unselected block.

22 Claims, 5 Drawing Sheets

PREVENTING DATA CORRUPTION IN A MEMORY DEVICE USING A MODIFIED MEMORY CELL CONDITIONING METHODOLOGY

FIELD OF THE INVENTION

This invention is generally related to memory devices and more particularly to techniques for preventing the corruption of data stored in flash memory devices.

BACKGROUND

Figure 3:
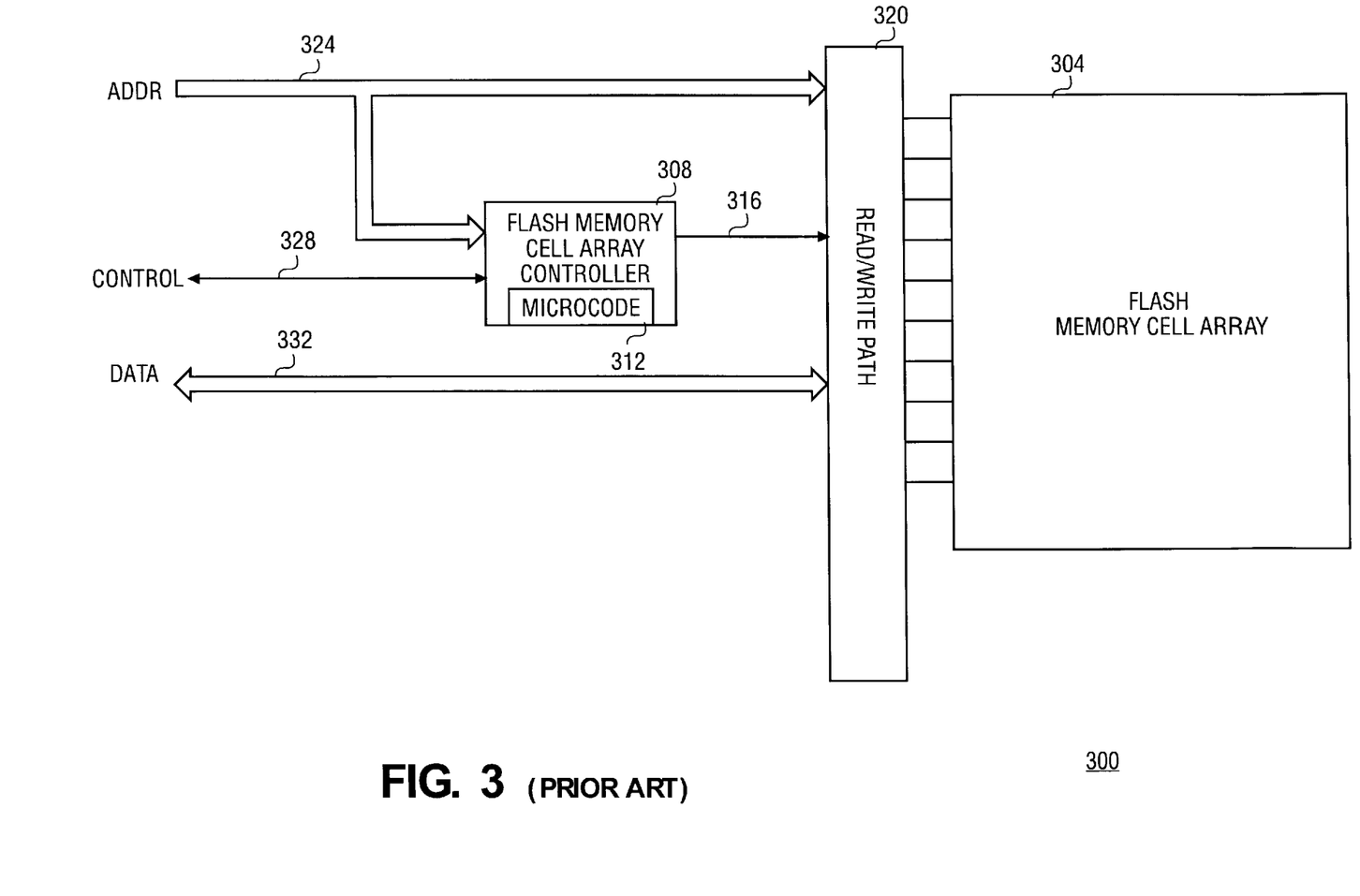
FIG. 3 shows a block diagram of a flash memory device that can be configured according to an embodiment of the invention.

Flash memory devices are used in a wide range of electronic systems that require reliable, non-volatile storage and retrieval of large amounts of data at low cost. A conventional flash memory device 300 as illustrated in FIG. 3 includes thousands of cells arranged in an array 304. Each cell can be configured to respond with a logical "0" or logical "1", and will maintain its state with the power off. A controller 308 operates by executing instructions that are provided by internal microcode 312 and by external commands received over an address bus 324 and a control bus 328. The controller 308 generates control signals 316 that cause read/write path circuitry 320 to "program" selected cells from a logical 0 state into a logical 1 state in accordance with data received over a data bus 332 where all cells had previously been "erased" into a logical 0 state. This data that has been stored in the cells can thereafter be read by issuing a read command to the controller 308. To explain the data corruption problem, some flash memory operations and part of a typical flash memory cell array 304 shown in FIG. 4 are described.

Figure 4:
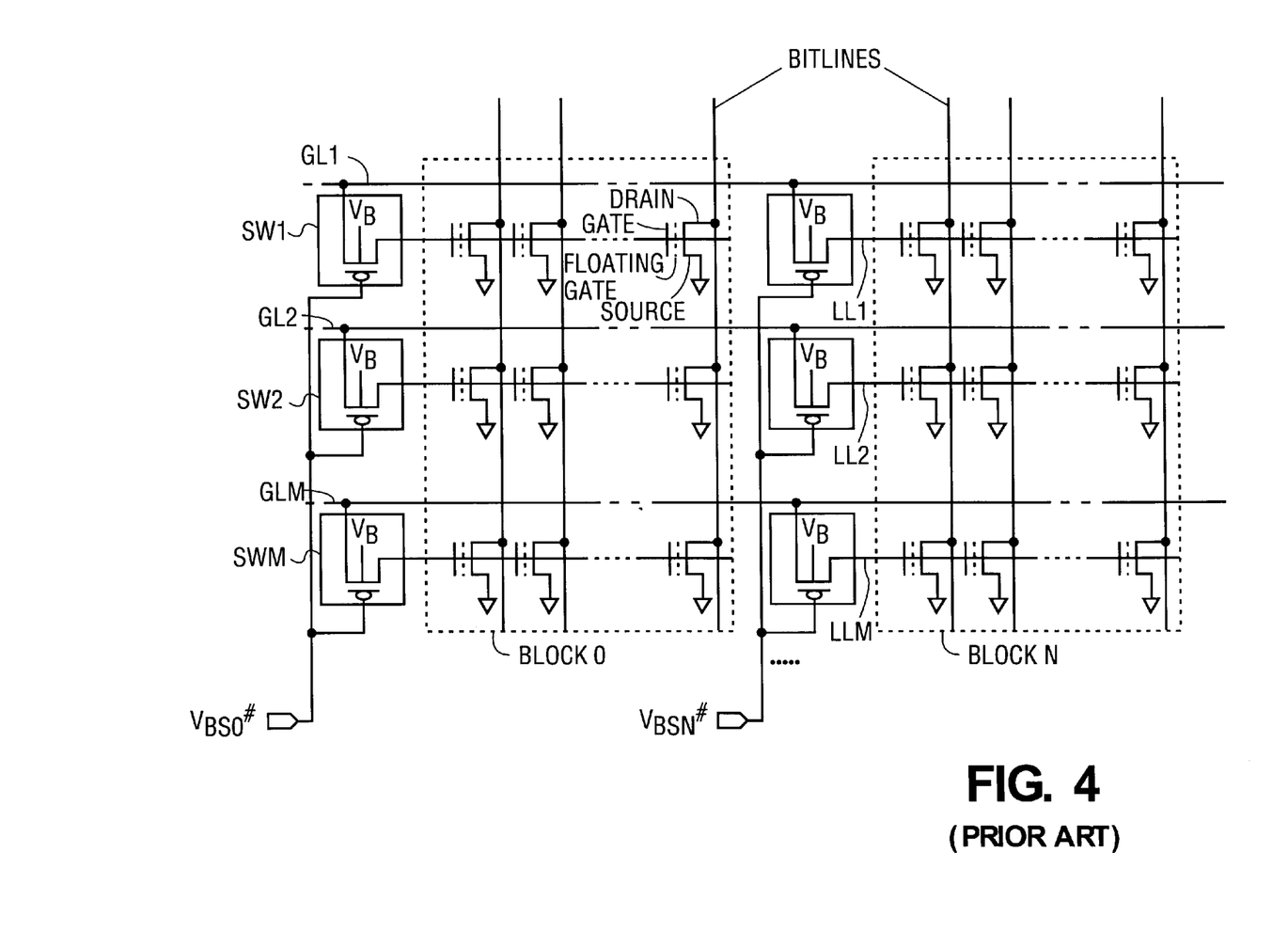
FIG. 4 shows a conventional flash memory cell array.

The portion of a flash memory cell array in FIG. 4 features a number of blocks 0 . . . N that are built in the substrate of an integrated circuit die. In this version, the blocks repeat horizontally along a number of global wordlines $GL_1$, $GL_2$, . . . $GL_M$. A number of cells are formed in each block. The gate terminals of all cells in a horizontal row are connected to the same, conducting, local wordline. The drain terminals of all cells in a vertical column are connected to the same, conducting, bitline. The drain, source and gate terminals of each cell are subjected to different voltages through high voltage conditioning circuitry (not shown) which causes a floating gate in each cell to exhibit different levels of charge, depending upon whether the cell is being programmed or erased. The amount of charge on the floating gate in part determines the state (0 or 1) of the cell. FIG. 4 shows the source terminals being coupled to the power supply/ground node (through control circuitry which is not shown) such as during program, read, or idle conditions.

Figure 5:
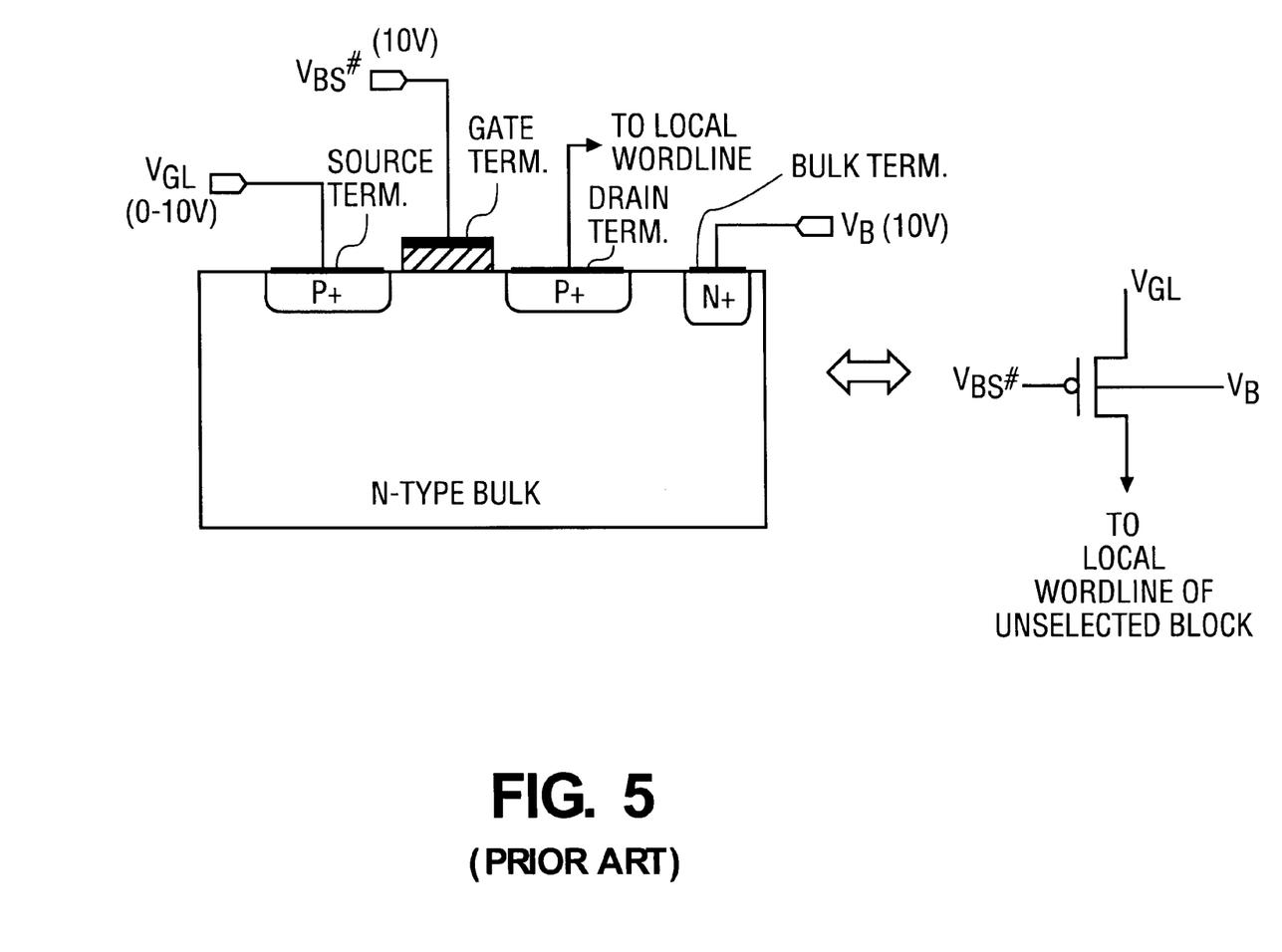
FIG. 5 illustrates the structure of a conventional p-channel MOSFET formed in an n-type tub.

Each global wordline $GL_i$ is coupled to a local wordline of a block through a switch $SW_i$ being a p-channel metal oxide semiconductor (MOS) field effect transistor (FET), such as the one shown in FIG. 5. This p-channel MOSFET is used as a switch to select or not select a block for erasing or programming. When $V_{BS}\#$ is asserted, the p-channel MOSFETs can conduct to apply the voltages on the global wordlines to their corresponding local wordlines in the selected block. When $V_{BS}\#$ is deasserted, the MOSFETs are cut off such that their associated local wordlines are floating. In practice, the p-channel MOSFETs for a given block are formed in a continuous n-type tub (also known as a "well") in a p-type semiconductor substrate. The electrical path to the n-type tub is represented by the fourth terminal of the MOSFET symbol, which is also known as the bulk terminal. To make more efficient use of the real estate available on the flash memory die and to simplify the control circuitry needed for its operation, two or more tubs on the die are shorted to each other and connected to a bulk voltage $V_B$. For the same reasons, the gates of all of the p-channel MOSFETs associated with the same block are shorted together and receive the same control signal $V_{BS}\#$.

Since the local wordlines LL1 . . . . LLM of an unselected block are floating, and the global wordlines GL1 . . . GLM can take on a range of voltages (e.g., 0–10 V) during an erase operation, the bulk terminal of each MOSFET is set to a sufficiently high voltage $V_B$ (e.g., 10 V) for proper operation as a switch, to ensure that the drain-bulk junction and the source-bulk junction of the MOSFET are never forward biased.

The erase operation in a flash memory device is typically performed one block at a time, where a block is selected by asserting its $V_{BS}\#$, while the $V_{BS}\#$ for the other unselected blocks remains deasserted. To avoid uneven erasure between cells, the erase operation is typically preceded by a conditioning step, sometimes referred to as "preconditioning", in which the floating gate in each of the cells in the selected block is charged up to the same level. During conditioning of a block, a relatively high voltage is asserted on a global wordline and its associated local wordline, while each bitline in the selected block is pulsed with a bitline conditioning voltage. This is done until all cells coupled to that wordline have been charged to the same level. The operation is repeated for all global wordlines that cross the selected block, so that the entire block will be charged to the same level. The block can then be uniformly erased.

The data stored in some of the cells of an unselected block in the flash memory device described above can become corrupted, i.e., a logical 0 can be transformed into a logical 1 and vice versa, after a given number of block erase operations have been performed. The data corruption tends to worsen at elevated operating temperatures, which suggests that a charge leakage phenomenon may be at fault. Generally, charge leakage may be reduced by clever circuit design or improvements to the semiconductor manufacturing process. However, such changes can be relatively expensive to implement because they involve making changes to the manufacturing production line for the flash memory device. Accordingly, there is a need for a less costly technique to remedy the above-described data corruption problem.

SUMMARY

An embodiment of the invention is directed to a method of operating a flash memory, by discharging at least one wordline, that is coupled to a first set of flash memory cells, during an interval in which a second set of flash memory cells are being conditioned, such that the at least one wordline does not develop a charge that is sufficient to corrupt the data stored in the first set.

Other features and advantages of the invention will be apparent from the accompanying drawings and from the detailed description that follows below.

BRIEF DESCRIPTION OF THE DRAWINGS

The invention is illustrated by way of example and not by way of limitation in the figures of the accompanying drawings in which like references indicate similar elements and in which.

DETAILED DESCRIPTION

According to an embodiment of the invention, the controller in a conventional flash memory device is modified to cause the local wordlines that are coupled to unselected sets of flash memory cells to discharge during an interval in which a selected set of flash memory cells are being conditioned. This modification is particularly advantageous for flash memory devices in which the cells of a selected block are conditioned prior to being erased. In such devices, the data contained in the unselected set of cells is subject to corruption during the conditioning interval, perhaps due to elevated voltages on the local wordlines that are coupled to the unselected set of cells. Such elevated voltages may be caused by charge leakage or coupling from the bulk to the source/drain regions of the MOSFETs that are being used as block select switches.

In certain embodiments of the invention, the needed modification to the conditioning methodology can be made relatively easily and at low cost by simply reprogramming the on-chip microcode to instruct the controller to pulse the $V_{BS}\#$ (block select) signal to the unselected blocks in the intervals in which the global wordlines are at ground potential. Alternative techniques for discharging the local wordlines of unselected sets of flash memory cells, to prevent the developing of a charge that is sufficient to corrupt the data stored in the cells, will be described below. It should be noted that references to "an" embodiment in this disclosure are not necessarily to the same embodiment, and they mean at least one.

Figure 1:
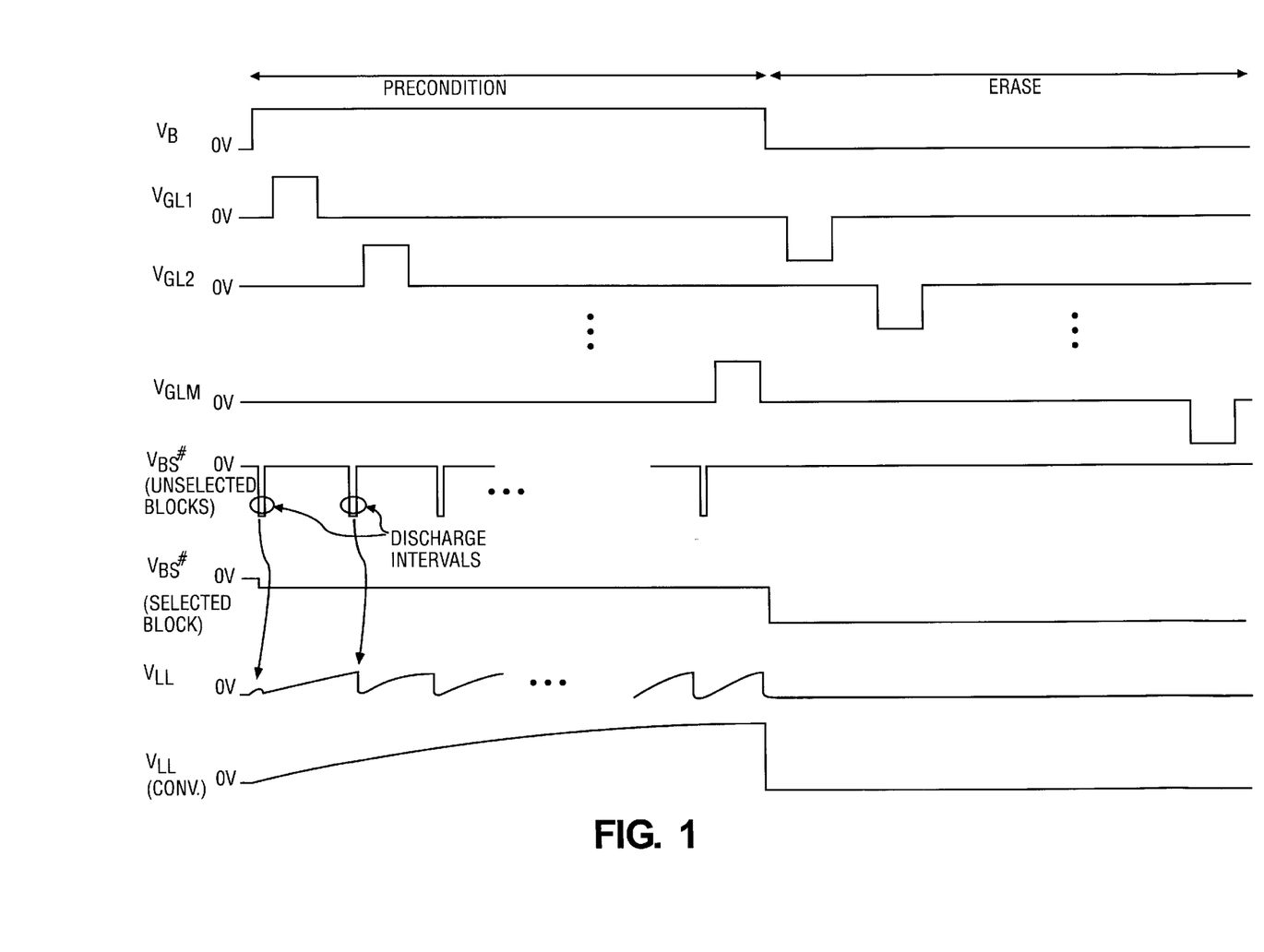
FIG. 1 shows a timing diagram of global wordline conditioning signals and block select signals for operating a flash memory device according to an embodiment of the invention.

FIG. 1 shows a timing diagram of global wordline voltages $V_{GL1}$, $V_{GL2}$, ... $V_{GLM}$ and block select voltages $V_{BS}\#$, for selected and unselected sets of flash cells, while operating a flash memory device according to an embodiment of the invention. The flash memory device may have the conventional array architecture shown in FIG. 4, or any other architecture in which corruption of data in unselected cells during a conditioning interval is a problem. In the embodiment that is configured according to FIG. 4, a set of flash memory cells are referred to as a block in which the cells are arranged as rows and columns that form an array. A number of bit lines cross each block and are shorted to the drain terminal of each cell in a column. Global wordlines having voltages $V_{GL1}$, $V_{GL2}$, ... $V_{GLM}$ are oriented horizontally and cross a number of blocks. Each block has a number of local wordlines LL1, LL2, . . . LLM, that are oriented horizontally and which are shorted to the gates of a number of cells in a given row. A low impedance path can be created between a global wordline and an associated local wordline for each block by a corresponding switch circuit $SW_i$ ($SW_1$, $SW_2$, ... $SW_M$). The switch circuit $SW_i$ includes a MOSFET being used as a switch. In this embodiment, the MOSFETs of a given block are p-channel devices that are formed in an n-type tub as shown in FIG. 5. However, the invention is not limited to such a configuration since a flash memory device having an n-channel device as formed in a p-type tub, which in turn is formed in an n-type substrate, might also benefit from the invention's techniques for discharging the local wordlines. The block select signals $V_{BS}\#$ ($V_{BS0}$, $V_{BS1}$ ... $V_{BSN}$) generated by the read/write path circuitry 320 in response to control signals received from the controller 308 (see FIG. 3 momentarily) are applied to the switch circuits $SW_i$ of each respective block. In this particular embodiment of the invention, the gate terminals of the p-channel MOSFETs receive the $V_{BS}\#$ and in response create a low impedance path between a global wordline and an associated local wordline, on a per block basis. Having described the flash cell array which receives the block select and conditioning signals, a method for preconditioning and erasing a block of a flash memory device while discharging the local wordlines in unselected blocks, according to the exemplary timing diagram of FIG. 1, is now described.

Operation begins when a block is selected to be erased. In a particular version of a flash memory device, each block can store 32K words of data. To avoid overerasure of the cells in the selected block, the erase procedure is preceded by a preconditioning procedure in which the floating gate in each cell of the selected block is made to exhibit the same charge. This preconditioning procedure may take a relatively long period of time, e.g., up to 1 second, as compared to other flash memory operations. In FIG. 1, the preconditioning procedure starts when $V_{BS}\#$ is asserted for conditioning the selected block, e.g., lowered to −3 Volts during the preconditioning interval, and $V_B$ is raised to a high voltage, e.g., 10.4 Volts. Thereafter, a number of sets of positive pulses that do not overlap in time are applied to a corresponding number of sets of global wordlines, respectively. In the embodiment of FIG. 1, each global wordline, whose voltage is represented as $V_{GLi}$, receives a separate, time shifted pulse of a relatively high voltage, e.g., 10.4 Volts. During the preconditioning interval, each of the global wordlines is subjected to at least one such pulse. While the positive pulse is asserted, a bitline conditioning voltage (not shown) is applied to all of the bitlines of the selected block until all cells that are coupled to the current global wordline on which the pulse is asserted have been charged to the same level. Each cell may include a floating gate which, following the application of the bitline conditioning voltage during the pulse, will exhibit the same charge as the other floating gates in the other cells in the same row. Once all cells in a given row have been conditioned in this way, the relatively high voltage on the current global wordline is deasserted, signifying the end of the positive pulse. The bitline conditioning operation can then proceed to the next row.

The cells in each row are subjected to bitline conditioning, typically in a consecutive fashion as illustrated in FIG. 1, until all rows of cells in the selected block have been conditioned. According to an embodiment of the invention, the discharging of the local wordlines of the unselected blocks occurs, in time, between the positive pulses on the global wordlines, when the voltages on the global wordlines are relatively low. The discharging in this embodiment is through a low impedance path, created after the voltage on the global wordline has dropped to a sufficiently low level, by allowing the switch circuits $SW_i$ of the unselected blocks to conduct one or more times in response to the $V_{BS}\#$ signal being asserted (see FIG. 4 momentarily).

The time interval during which the $V_{BS}\#$ signals for the unselected blocks are asserted can be minimized if the switch circuits $SW_i$ have very low impedance when they are turned on, and if the global wordlines drop down to zero (ground) potential in between pulses, as shown in FIG. 1. An alternative here would be to use a circuit which does not display the low impedance that is typical of a switch, yet is still able to cause the local wordline to sufficiently discharge so as not to corrupt the data stored in the cells that are coupled to the local wordline. Another alternative is to reference the positive pulses that are applied to the global wordlines with respect to a potential other than zero Volts, yet still be able to sufficiently discharge the local wordline so that the data stored in the cells that are coupled to the local wordline are not disturbed. The interval of time during which a local wordline is discharged and the rate at which the discharge interval is repeated during the preconditioning interval should be selected as to ensure that none of the local wordlines of the unselected blocks in the flash memory device develop a charge that is sufficient to corrupt or disturb the data stored in the flash memory cells of these blocks. It should be noted that if a very low impedance switch circuit is used in conjunction with pulses on the global wordlines that are referenced to zero Volts, as in a typical flash memory device, the additional period of time required by the invention for discharging the local wordlines of the unselected blocks is a very small percentage of the conventional preconditioning interval. This additional time is even less significant when compared to the total interval that includes preconditioning as well as erasing, which is shown in FIG. 1, making the solution provided by the invention even more desirable from an overall system timing point of view.

Once the preconditioning of all rows in the selected block has been completed, the bulk voltage $V_B$ can be lowered during the ensuing erase interval. Lowering $V_B$ helps reduce the body effect in the p-channel MOSFETs of the switch circuits $SW_i$, while still ensuring that the drain to bulk and source to bulk junctions of the MOSFETs remain reverse biased. The $V_B$ may be lowered during the erase interval, because the voltage $V_{GL}$ on a global wordline will be a negative pulse referenced to ground (see FIG. 1, erase interval). In that case, neither of the source to bulk or the drain to bulk junctions of the p-channel MOSFET of FIG. 5 will conduct, because the bulk will always be at the same or higher potential as the drain or source.

Having described a procedure for avoiding the problem of data corruption in a flash memory device, a more detailed examination of a cause of this problem will be given. Referring to FIG. 5, in an ideal situation, the p-n junction between the n-type bulk and the p diffusion connected to the drain terminal of the MOSFET, on the local wordline side, is reverse-biased, and $V_B$ on the bulk terminal cannot propagate onto the local wordline. In reality, a small leakage exists from the bulk to the p diffusion, which is dependent on operating temperature and transistor characteristics. When the above mentioned leakage exists, the drain terminal, and hence the local wordline, charges up at a speed that is dictated by a resistor-capacitor (RC) model. The reversed biased p-n junction may be represented as a resistor ($R_j$) and the local wordline as a capacitor ($C_{LL}$). The transient voltage on the local wordline ($V_{LL}$) can be expressed as:

$$V_{LL}=V_B*[1-\exp(-t/R_j*C_{LL})]$$

In this equation, if t is relatively small compared to RC, then $V_{LL}$ is virtually insignificant. However, if t is relatively large as with the preconditioning algorithm (and much greater than RC), $V_{LL}$ may increase up to $V_B$. As mentioned earlier, this relatively high voltage may unintentionally charge or discharge the floating gates of the unselected flash cells that are connected to the local wordline, resulting in device malfunction. Also, at extended and automotive temperatures (100–140 C) the leakage is several times higher than at room temperature, causing the local wordlines in unselected blocks to attain disturb levels, sufficient to corrupt stored data, in a relatively short period of time.

There are several ways to prevent such disturbances. Normally, the operating temperature is in a wide range, which is dictated by the usage environment. One has limited control of it. The p-channel transistor characteristics also have a strong impact on the leakage and hence $R_j$. However, changes in transistor characteristics and $C_{LL}$ are limited by technology and normally result in a significant cost increase in modifying the fabrication processes.

Time t is another factor that is affecting $V_{LL}$. The invention limits the length of time t in which $V_{LL}$ is allowed to increase, by periodically grounding the unselected local wordlines so that the wordlines are never charged to a voltage level that causes the flash cell to be disturbed. This may be achieved according to an embodiment of the invention by a modification in the microcode that controls the preconditioning sequence. FIG. 1 illustrates the behavior of an unselected local wordline voltage $V_{LL}$ (conv.) obtained as a result of conventional microcode. In this case, the unselected local wordline voltage is in a continuous rise until the preconditioning of all the flash cells in a selected block has been completed, at which point the unselected local wordlines are grounded and discharged.

Also shown in FIG. 1 is the behavior of $V_{LL}$ obtained with the microcode configured according to an embodiment of the invention. In this case, the altered microcode causes the unselected local wordlines in the flash memory device to be periodically grounded even before the preconditioning of all flash cells in a selected block has been completed. The grounding of the unselected local wordlines is achieved through turning on respective p-channel MOSFETs in $SW_i$ while grounding the corresponding global wordlines $GL_i$ (see FIG. 4). Since the discharge in this embodiment of the invention is through grounded global wordlines, the discharge time is minimal. Therefore, the invention's change to the microcode has minimal impact on the time needed for preconditioning each block.

In an embodiment of the invention, the flash memory device shown in FIG. 3 features a conventional controller 308 which includes a processor and a machine-readable medium having microcode 312 (instructions) which, when executed by the processor, cause the high voltage circuitry in the read/write path circuitry 320 to provide the wordline conditioning voltage $V_{GLi}$, the block select signals $V_{BS}$#, and bitline conditioning voltages in accordance with a timing indicated in the instructions. Such a timing may be according to, for instance, the timing diagram of FIG. 1. The machine readable medium may be a one-time programmable memory, such as a programmable read-only memory (PROM) or other suitable programmable medium. Although the above-described techniques of discharging the local wordlines of the unselected blocks may be particularly advantageous if implemented as a change in the microcode 312 of a conventional flash controller 308 (see FIG. 3 momentarily), an alternative may be to implement the controller circuitry, including the portion responsible for the timing that is used to generate the $V_{BS}$# signals for the unselected blocks, purely as hard-wired logic. Such an implementation, however, may be less flexible than the above-mentioned programmable controller. In either scenario, the controller 308 or other controller circuitry may be configured to cause the wordline conditioning voltage that is generated by high voltage circuitry in the read/write path circuitry 320 (see FIG. 3 momentarily) to be applied as sets of pulses that do not overlap in time, and the local wordlines of unselected blocks to be discharged by, for instance, repeatedly causing the high voltage circuitry to generate pulses in the $V_{BS}$# signals of the unselected blocks, as shown in the exemplary timing diagram of FIG. 1.

Figure 2:
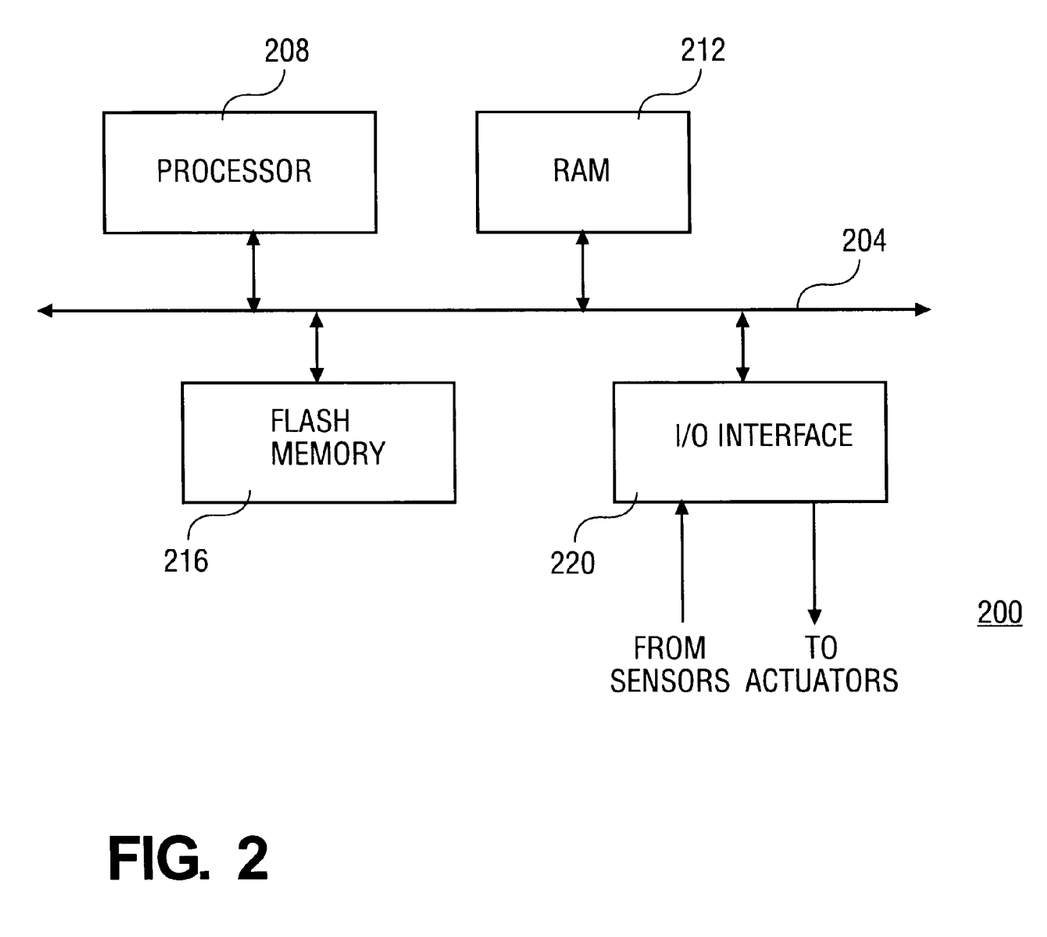
FIG. 2 depicts a system application of a flash memory device configured according to an embodiment of the invention.

FIG. 2 illustrates another embodiment of the invention as an electronic system 200 that includes a flash memory device 216 configured with one of the local wordline discharging techniques described above. The system 200 features a bus 204 to which a number of devices may be coupled, depending on the system application. In most such applications, a processor 208 is coupled to the bus 204 and executes instructions stored in the flash cells of the flash memory device 216 that will ultimately result in operations specific to each system application. For instance, the system 200 may be a control module that is used in the automotive industry to control the operations of an automobile. The I/O interface 220 will receive input signals from sensors in the automobile and will provide control signals to actuators, while under the control of the processor 208 executing instructions in the flash memory 216. For such system applications, the flash cells in the flash memory 216 may store a number of system parameters, such as sensor and actuator parameters. These parameters are stored in a non-volatile manner, can be randomly accessed, and can be updated on a per block basis relatively easily whenever the system application is to be updated.

Another system application is a mobile telephone in which the flash memory 216 will contain a boot block of code that is executed upon start-up by the processor 208 to initialize the communication channel between the mobile telephone and a base station. In other applications, the processor 208 will also execute a program that is temporarily stored in a volatile memory 212 which may include one or more random access memory (RAM) devices. In such applications, including portable and desktop computers, the volatile memory 212 can provide a program working area having higher speed read/write access than the flash memory 216.

To summarize, different embodiments of the invention have been described for preventing data corruption in a flash memory device using a modified memory cell conditioning methodology. The methodology, in a particular embodiment of the invention, discharges the local wordlines of unselected blocks during the preconditioning of a selected block, where the local wordlines otherwise might have been charged to unsuitably high levels that would cause the corruption of data stored in the unselected blocks. In the foregoing specification, the invention has been described with reference to specific exemplary embodiments thereof. It will, however, be evident that various modifications and changes may be made thereto without departing from the broader spirit and scope of the invention as set forth in the appended claims. For instance, the conventional architecture of FIG. 4 is simply one example of a flash memory cell array architecture that may benefit from the invention's techniques. The flash array may alternatively be built on an n-type substrate, in which the n-channel MOSFETs that form the switch circuits for each block are built in separate p-type tubs which are shorted together and receive a bulk voltage $V_B$. In that case, the global wordline, the block select, and any bitline or source conditioning voltages will be different than the examples given above, but the same techniques for discharging the local wordlines may be used. The specification and drawings are, accordingly, to be regarded in an illustrative rather than a restrictive sense.

What is claimed is:

1. A method of operating a flash memory, comprising:
   discharging at least one local wordline that is coupled to a first set of flash memory cells, during an interval in which a second set of flash memory cells are being conditioned, such that the at least one local wordline does not develop a charge that is sufficient to corrupt the data stored in the first set; and
   erasing the second set after the interval in which the second set is conditioned, wherein the conditioning avoids overerasure of the second set.

2. The method of claim 1 wherein the conditioning causes a floating gate in each of the second set of flash memory cells to exhibit the same charge.

3. The method of claim 2 wherein the discharging includes creating a low impedance path from the at least one wordline to an associated global wordline.

4. The method of claim 3 wherein the conditioning includes applying a plurality of sets of pulses that do not overlap in time to a plurality of sets of global wordlines, respectively, the creation of the low impedance path occurs between the pulses.

5. The method of claim 3 wherein the associated global wordline is at a ground potential whenever the low impedance path is created.

6. A storage device comprising:
   first set of flash memory cells having a plurality of groups of first cells;
   plurality of first local wordlines each coupled to a respective one of the plurality of groups of first cells;
   second set of flash memory cells having a plurality of groups of second cells;
   plurality of second local wordlines each coupled to a respective one of the plurality of groups of second cells; and
   controller being configured to cause the first local wordlines to discharge during an interval in which the second set of flash memory cells are conditioned, and then the second set of cells to be erased after being conditioned, and wherein the second set of cells are conditioned to avoid subsequent overerasure.

7. The storage device of claim 6 wherein the second set of cells are conditioned by causing a floating gate in each of the second set of cells to exhibit the same charge.

8. The storage device of claim 6 wherein the first local wordlines are discharged so that the first local wordlines do not develop a charge that is sufficient to corrupt the data stored in the first set of flash memory cells.

9. The storage device of claim 6 further comprising:
   a plurality of global wordlines;
   a plurality of first switch circuits each being coupled to provide a first low impedance path between one of the first local wordlines and a corresponding one of the global wordlines in response to the controller; and
   a plurality of second switch circuits each being coupled to provide a second low impedance path between one of the second local wordlines and a corresponding one of the global wordlines to cause said one of the second local wordlines to discharge in response to the controller.

10. The storage device of claim 9 wherein each of the plurality of first switch circuits includes at least one first p-channel MOSFET coupled to provide the first low impedance path.

11. The storage device of claim 10 wherein each of the plurality of second switch circuits includes at least one second p-channel MOSFET coupled to provide the second low impedance path.

12. The storage device of claim 11 wherein each of the first and second p-channel MOSFETs has a bulk terminal to be coupled to a voltage that is sufficient to ensure that a drain-bulk junction of each MOSFET remains reverse biased.

13. The storage device of claim 11 wherein the first p-channel MOSFETs are formed in a first n-type tub and the second p-channel MOSFETs are formed in a second n-type tub.

14. The storage device of claim 9 further comprising
a plurality of bitlines each being coupled to a respective cell in one of the groups of second cells; and
read/write path circuitry that includes high voltage circuitry coupled to provide a wordline conditioning voltage on the global wordlines and a bitline conditioning voltage on each of the first bitlines in response to the controller.

15. The storage device of claim 14 wherein the controller includes a machine-readable medium having instructions which when executed by the controller cause the high voltage circuitry to provide the wordline conditioning voltage and the bitline conditioning voltage in accordance with a timing indicated in the instructions.

16. The storage device of claim 15 wherein the machine-readable medium is one time programmable.

17. The storage device of claim 9 wherein the controller is configured to cause the wordline conditioning voltage to be applied as sets of pulses that do not overlap in time to a corresponding plurality of sets of the global wordlines, and to cause the first local wordlines to be discharged through global wordlines in between the pulses.

18. The storage device of claim 17 wherein the sets of pulses are referenced to ground, the first local wordlines being discharged to ground.

19. An electronic system comprising:
bus;
processor coupled to the bus; and
flash memory device coupled to the bus for containing instructions to be executed by the processor, the flash memory device comprising a first set of flash memory cells having a plurality of groups of first cells, a plurality of first local wordlines each coupled to a respective one of the plurality of groups of first cells, a second set of flash memory cells having a plurality of groups of second cells, a plurality of second local wordlines each coupled to a respective one of the plurality of groups of second cells, and a controller being configured to cause the first local wordlines to discharge during an interval in which the second set of flash memory cells are conditioned, and then the second set of cells to be erased after being conditioned, and wherein the second set of cells are conditioned to avoid subsequent overerasure.

20. The system of claim 19 further comprising:
volatile memory coupled to the bus for containing instructions to be executed by the processor and for providing a program working area.

21. The system of claim 20 further comprising:
I/O interface to sensors and actuators, the flash memory device containing sensor parameters.

22. The system of claim 20 wherein the flash memory device contains a boot block to be executed by the processor upon startup of the system.

* * * * *